(12) United States Patent
Kwan et al.

(10) Patent No.: US 7,614,540 B2
(45) Date of Patent: Nov. 10, 2009

(54) THERMAL INSULATION FOR A BONDING TOOL

(75) Inventors: Ka Shing Kenny Kwan, Singapore (SG); Boon June Yeap, Singapore (SG)

(73) Assignee: ASM Technology Singapore Pte Ltd., Singapore (SG)

( * ) Notice: Subject to any disclaimer, the term of this patent is extended or adjusted under 35 U.S.C. 154(b) by 164 days.

(21) Appl. No.: 11/744,469

(22) Filed: May 4, 2007

(65) Prior Publication Data

US 2008/0272179 A1    Nov. 6, 2008

(51) Int. Cl.
*B23K 1/06* (2006.01)
*B23K 37/00* (2006.01)

(52) U.S. Cl. .............. 228/180.5; 228/4.5; 228/904; 228/1.1; 228/110.1; 228/59

(58) Field of Classification Search ............ 228/180.5, 228/4.5, 1.1, 904, 110.1
See application file for complete search history.

(56) References Cited

U.S. PATENT DOCUMENTS

| 5,263,630 | A  | * | 11/1993 | Kanomata et al. ............. 228/1.1 |
| 5,931,368 | A  | * | 8/1999  | Hadar et al. .................. 228/4.5 |
| 2003/0218050 | A1 | * | 11/2003 | Kanemoto et al. ........... 228/103 |
| 2004/0164129 | A1 | * | 8/2004  | Sonnenreich et al. ..... 228/180.5 |
| 2008/0203136 | A1 | * | 8/2008  | Seyama ...................... 228/1.1 |

* cited by examiner

*Primary Examiner*—Kiley Stoner
*Assistant Examiner*—Erin B Saad
(74) *Attorney, Agent, or Firm*—Ostrolenk Faber LLP

(57) ABSTRACT

A bonding apparatus comprising a bond arm and a wire bonding tool mounted to the bond arm is provided with thermal insulation in the form of a thermal shield substantially enclosing the bonding tool for insulating the bonding tool from ambient heat.

11 Claims, 4 Drawing Sheets

THERMAL INSULATION FOR A BONDING TOOL

FIELD OF THE INVENTION

The present invention relates to thermal insulation of a bonding tool, such as a wire bonding tool, to protect the bonding tool from external heat sources during operation thereof.

BACKGROUND AND PRIOR ART

Wire bonding is typically applied to make electrical connections between an integrated circuit die or chip and a carrier on which the die is mounted. Bonding wires are attached to bond pads on the chip and bonding leads on the carrier respectively by ultrasonic welding using an ultrasonic transducer which is integrated into a wire bonding apparatus. The ultrasonic transducer is an energy converting-device which converts electrical energy into ultrasonic vibrations and transmits the ultrasonic vibrations to a capillary at a tip end of the transducer to perform wire bonding.

FIG. 1 illustrates a side view of a conventional wire bonding apparatus 10 with a transducer 12 positioned over a bonding area for wire bonding. The transducer 12 has a long slender rod-shaped horn 13 and a capillary 16 located at a tip end of the horn 13. Wire is threaded through the capillary 16 and extends out of the capillary tip. The capillary 16 is raised or lowered with respect to a bonding area by moving the transducer 12 vertically.

An ultrasonic generator 17 is connected to an end of the horn 13 that is opposite to the tip end of the horn 13 where the capillary 16 is mounted. The ultrasonic generator 17, typically comprising a stack of piezoelectric elements, is housed in a transducer holder 14 mounted on a bond arm 18. The transducer holder 14 is supported by the bond arm 18, which is in turn connected to a sliding bar 22 at a pivot 20. Rotational motion of the bond arm 18 about the pivot 20 rotates the bond arm 18 up and down thereby raising or lowering the transducer 12 relative to the bonding area. The sliding bar 22 may further move and position the bond arm 18 and transducer 12 along the x and y axes.

A carrier 26, on which components such as semiconductor dice and bonding wires are attached, is held in position by a window clamp 24 on a wire bonding platform to perform wire bonding. The wire bonding platform includes a heater block 28 which provides heat to the carrier 26 to facilitate wire bonding conducted on it.

During wire bonding, the ultrasonic generator 17 produces ultrasonic vibrations which are transmitted along the horn 13. The long slender rod shape of the horn 13 is suitable for amplifying the ultrasonic vibrations transmitted to the capillary 16 while suppressing attenuation. In this way, ultrasonic vibrations may be transferred to the capillary 16 efficiently.

A pressing force is also applied to the capillary 16, and bonding is accomplished by applying the ultrasonic energy transmitted through the horn 13 onto the wire that is subsequently attached to bonding pads, typically on the semiconductor dice. Control of the positioning of the capillary 16 relative to the bonding area is essential to perform wire bonding accurately. This is particularly so when very fine wires and bond pitches are involved.

As can be seen in FIG. 1, the transducer 12 is positioned over the heating zone during wire bonding. Heat is transmitted to the immediately vicinity of the heater block 28, which means that the transducer 12 is exposed to heat from the heater block 28 by radiation. The heat may cause the transducer 12 and the transducer holder 14 to expand. This may therefore affect the relative positioning of the capillary 16 and a bonding position. As a result, wire bonding accuracy is affected.

A thermal shield may be used for reducing heat transmission from the heater block 28 to the transducer 12 and the transducer holder 14. FIG. 2 is a side view of the wire bonding apparatus 10 with a thermal shield 30 affixed to the sliding bar 22 of the wire bonding apparatus. The thermal shield 30 is operative to separate the transducer 12 from the heater block 28, thereby reducing radiation of heat from the heater block 28 directly to the transducer 12. However, the window clamp 24 needs to be lifted to unclamp the carrier 26 every time the carrier 26 is moved or when it is removed from the heater block 28. The presence of the thermal shield 30 limits the vertical distance A that is movable by the window clamp 24. It is desirable to increase the vertical distance that is movable by the window clamp 24 to ensure sufficient clearance of the window clamp from the carrier 26 and the components attached thereon when the carrier 26 needs to be moved.

FIG. 3 illustrates a front view of the wire bonding apparatus of FIG. 2 showing the thermal shield 30 between the transducer 12 and the heater block 28. While the thermal shield 30 may reduce the heat radiated from the heater block 28 to the transducer 12, it is noted that the transducer 12 is still exposed to ambient heat from the surrounding air above the thermal shield 30. The transducer 12 and transducer holder 14 would still expand such as to change the relative positioning of the capillary 16 and the carrier 26, resulting in decreased wire bonding accuracy.

FIG. 4 is a side view of the wire bonding apparatus 10 of FIG. 2 illustrating movement of the transducer 12 along the y and z axes. The thermal shield 30 is movable together with the sliding bar 22 along the x and y axes as it is attached to the sliding bar 22. However, when the transducer 12 moves along the z-axis by rotary movement of the bond arm 18 about the pivot 20, the thermal shield 30 cannot move correspondingly in the z axis. Thus, the transducer 12 is likely to receive more heat energy from the surrounding air as it moves further away from the thermal shield 30. For the aforesaid reasons, use of a conventional thermal shield in a wire bonding system does not effectively address the problem of thermal instability encountered by a transducer during wire bonding. It would be desirable to provide better thermal protection to the transducer 12 from the heater block 28.

SUMMARY OF THE INVENTION

It is thus an object of this invention to seek to reduce the amount of heat being transferred to a bonding tool from external heat sources so as to minimize any thermal expansion experienced by the bonding tool.

Accordingly, the invention provides a bonding apparatus comprising: a bond arm; a wire bonding tool mounted to the bond arm; and a thermal shield substantially enclosing the bonding tool for insulating the bonding tool from ambient heat.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of a preferred embodiment of the invention when considered with the accompanying drawings, in which.

DETAILED DESCRIPTION OF THE PREFERRED EMBODIMENT OF THE INVENTION

The preferred embodiment of the present invention will be described hereinafter with reference to the accompanying drawings.

Figure 1:
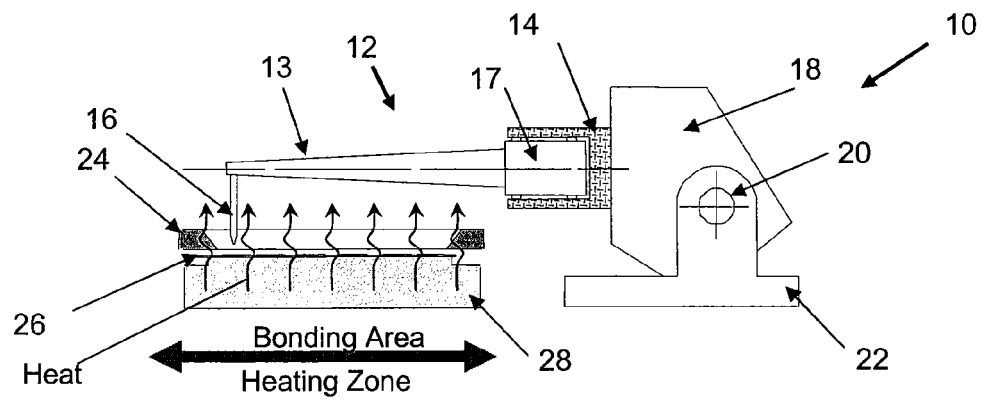
FIG. 1 is a side view of a conventional wire bonding apparatus with a transducer positioned over a bonding area for wire bonding.
Figure 2:
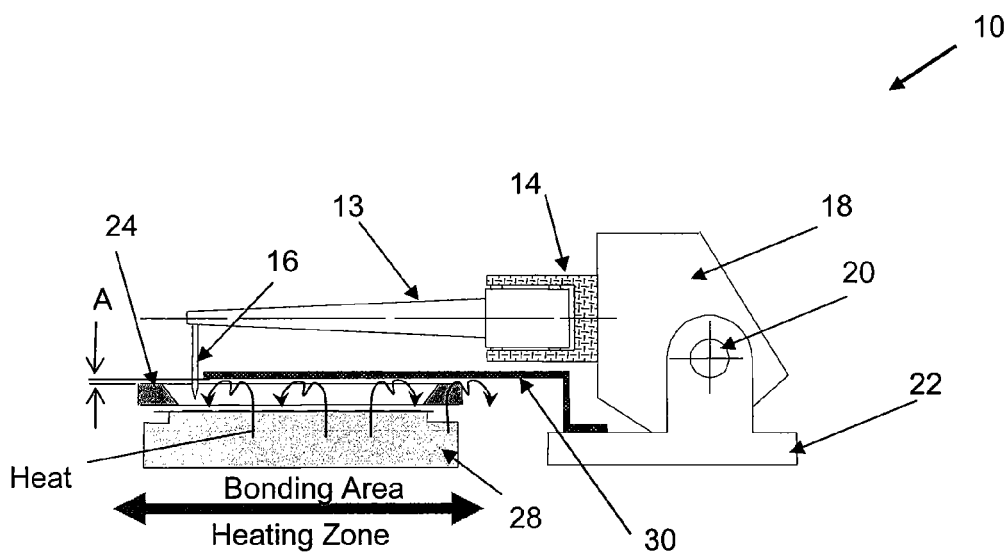
FIG. 2 is a side view of the wire bonding apparatus with a thermal shield affixed to the apparatus.
Figure 3:
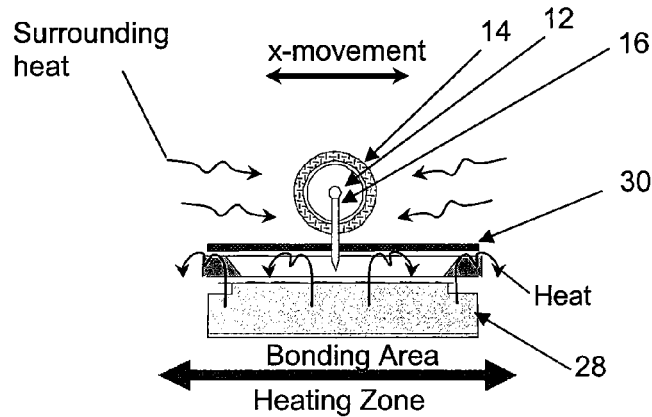
FIG. 3 is a front view of the wire bonding apparatus of FIG. 2 showing the thermal shield between the transducer and a heater block.
Figure 4:
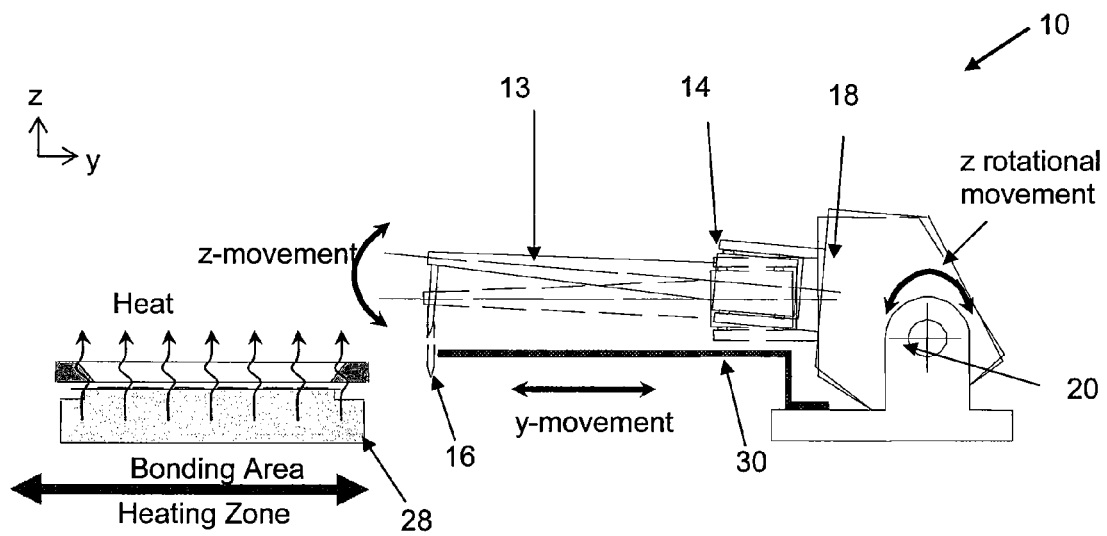
FIG. 4 is a side view of the wire bonding apparatus of FIG. 2 illustrating movement of the transducer along the y and z axes.
Figure 5:
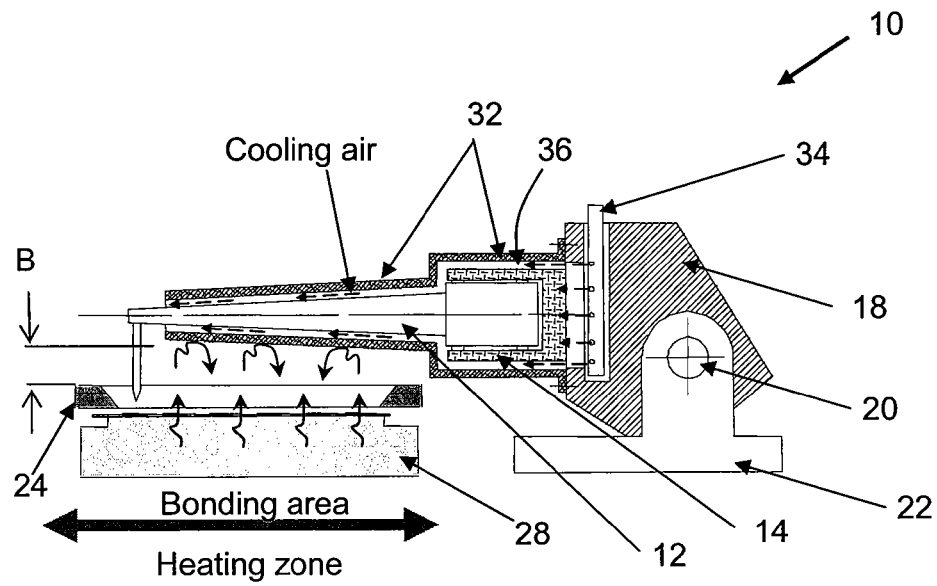
FIG. 5 is a side view of a wire bonding apparatus with a transducer and a transducer holder substantially enclosed within a thermal shield according to the preferred embodiment of the invention.

FIG. 5 is a side view of a wire bonding apparatus 10 with a bonding tool such as a transducer 12 and a transducer holder 14 substantially enclosed within a thermal shield 32 according to the preferred embodiment of the invention. The transducer 12 is mounted to the bond arm 18 by way of the transducer holder 14 of the bond arm 18. The thermal shield 32 may be made from any insulating material, such as plastic, which provides suitable heat insulation of the transducer 12 from ambient heat during wire bonding. A substantial length of the transducer 12 is encircled by the thermal shield 32, generally leaving uncovered only a tip end of the transducer 12 where the capillary 16 is located. By substantially enclosing the transducer 12 and transducer holder 14, the thermal shield 32 reduces heat radiation from the heater block 28 being received directly by the transducer 12.

Optionally, cooling air may be introduced in a gap 36 between the thermal shield 32 and the transducer 12 and transducer holder 14, through an air nozzle 34. The air nozzle 34 is preferably connected to the bond arm 18 for introducing cooling air into the gap 36. This cools the transducer 12 and transducer holder 14 further to improve thermal stability. This view also shows that the preferred embodiment of this invention increases the vertical distance B movable by the window clamp 24. This ensures that a sufficient clearance from the carrier 26 and the components present thereon when raising the window clamp 24.

Figure 6:
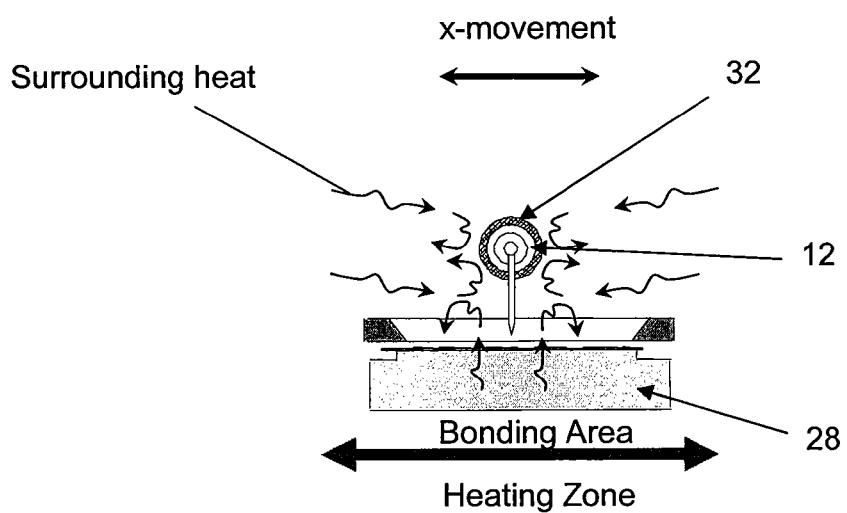
FIG. 6 is a front view of the wire bonding apparatus of FIG. 5 showing the transducer substantially enclosed in the thermal shield.

FIG. 6 is a front view of the wire bonding apparatus 10 of FIG. 5 showing the transducer 12 substantially enclosed in the thermal shield 32. As the transducer 12 is substantially covered within the thermal shield 32, transmission of heat from external heat sources to the transducer 12 is impeded. Preferably, the shape of the thermal shield 32 substantially conforms to the shape of the bonding tool comprising the transducer 12 as well as the transducer holder 14 to minimize the gap 36. This ensures that less heat reaches the transducer 12 and transducer holder 14 by convection via the surrounding air, and also makes the system more compact.

Figure 7:
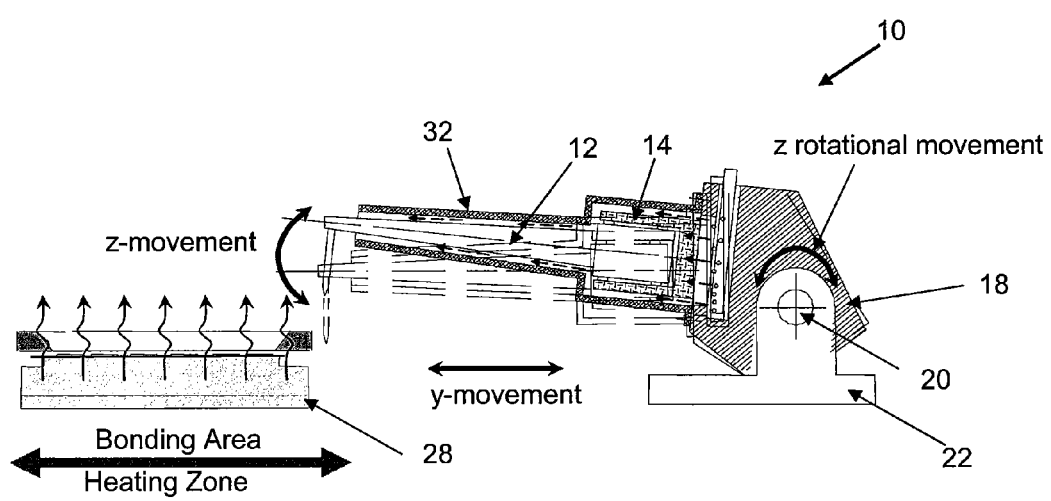
FIG. 7 is a side view of the wire bonding apparatus of FIG. 5 illustrating movement of the transducer, transducer holder and thermal shield in the y and z axes.

FIG. 7 is a side view of the wire bonding apparatus 10 of FIG. 5 illustrating movement of the transducer 12, transducer holder 14 and thermal shield 32 in the y and z axes. This view shows that the thermal shield 32 is mounted on the bond arm 18 so that it is movable together with the bond arm 18 and therefore it is also movable together with the transducer 12. The advantage is that the thermal shield 32 moves together with the transducer 12 and the transducer holder 14 in the z-axis as the bond arm 18 rotates about the pivot 18. Unlike the conventional thermal shield 30, the degree of heat insulation provided by the thermal shield 32 in accordance with the preferred embodiment of the invention is unchanged by z-axis motion of the transducer 12 and transducer holder 14.

It should be appreciated that the thermal shield in accordance with the preferred embodiment of the invention improves the efficiency of thermal insulation to the bonding system, in particular the transducer 12 and transducer holder 14, to achieve thermal stability of the whole bonding system. The space constraint caused by conventional thermal shields that are affixed to the slider bar 22 is also obviated to ensure a greater clearance B between the window clamp 24 and the carrier 26 when the carrier needs to be unclamped. Moreover, the thermal stability of the bonding system leads to improved accuracy of ball placement at the bonding positions, usually on the bonding pads of the semiconductor dice.

The invention described herein is susceptible to variations, modifications and/or additions other than those specifically described and it is to be understood that the invention includes all such variations, modifications and/or additions which fall within the spirit and scope of the above description.

The invention claimed is:

1. A bonding apparatus comprising:
   a bond arm including a transducer holder;
   a wire bonding tool comprising a transducer mounted to the transducer holder; and
   a thermal shield substantially enclosing both the transducer and the transducer holder and positioned to insulate the bonding tool from ambient heat.

2. The bonding apparatus as claimed in claim 1, wherein the thermal shield comprises a heat insulating material.

3. The bonding apparatus as claimed in claim 2, wherein the insulating material comprises plastic.

4. The bonding apparatus as claimed in claim 1, including a gap positioned between the wire bonding tool and the thermal shield and configured to introduce cooling air between the wire bonding tool and the thermal shield.

5. The bonding apparatus as claimed in claim 4, further comprising an air nozzle connected to the bond arm, the air nozzle positioned and configured to introduce said cooling air into the gap.

6. The bonding apparatus as claimed in claim 1, wherein a shape of the thermal shield conforms to a shape of the wire bonding tool.

7. The bonding apparatus as claimed in claim 1, wherein a substantial length of the bonding tool is encircled by the thermal shield.

8. The bonding apparatus as claimed in claim 1, wherein the thermal shield is mounted so as to be movable together with the bonding tool.

9. The bonding apparatus as claimed in claim 8, wherein the thermal shield is mounted to the bond arm and is movable together with the bond arm.

10. A bonding apparatus comprising:

a bond arm;

a wire bonding tool mounted to the bond arm; and a thermal shield substantially enclosing the bonding tool operable to insulate the bonding tool from ambient heat, wherein a gap is positioned between the wire bonding tool and the thermal shield and is configured to introduce cooling air between the wire bonding tool and the thermal shield.

11. The bonding apparatus as claimed in claim 10, further comprising an air nozzle connected to the bond arm, the air nozzle positioned and configured to introduce said cooling air into the gap.

* * * * *